(12) United States Patent
Pujol et al.

(10) Patent No.: US 7,859,332 B2
(45) Date of Patent: Dec. 28, 2010

(54) AMPLIFICATION CIRCUIT AND METHOD THEREFOR

(75) Inventors: Alexandre Pujol, Toulouse (FR);
Stephane Ramond, Flourens (FR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 803 days.

(21) Appl. No.: 11/815,431

(22) PCT Filed: Jul. 25, 2006

(86) PCT No.: PCT/US2006/028987

§ 371 (c)(1),
(2), (4) Date: Aug. 2, 2007

(87) PCT Pub. No.: WO2008/013531

PCT Pub. Date: Jan. 31, 2008

(65) Prior Publication Data

US 2010/0141342 A1    Jun. 10, 2010

(51) Int. Cl.
*H03F 1/14* (2006.01)
(52) U.S. Cl. .................................................. 330/51
(58) Field of Classification Search ................ 330/51, 330/149; 381/94.5, 120
See application file for complete search history.

(56) References Cited

U.S. PATENT DOCUMENTS 5,648,742 A * 7/1997 Ghaffaripour et al. ......... 330/51
5,939,938 A * 8/1999 Kalb et al. ..................... 330/51
6,937,103 B2 * 8/2005 Inagaki ......................... 330/297

* cited by examiner

*Primary Examiner*—Steven J Mottola
(74) *Attorney, Agent, or Firm*—Robert F. Hightower

(57) ABSTRACT

In one embodiment, an amplification circuit charges a filter capacitor (14) and an input capacitor (12) with a substantially constant current and subsequently forms a delay prior to operating the amplification circuit to amplify input signals.

19 Claims, 5 Drawing Sheets

AMPLIFICATION CIRCUIT AND METHOD THEREFOR

BACKGROUND OF THE INVENTION

The present invention relates, in general, to electronics, and more particularly, to methods of forming semiconductor devices and structure.

In the past, the semiconductor industry utilized various methods and circuits to form audio amplifiers. These audio amplifiers generally received an input signal and differentially drove a speaker in order to form sound. One example of such an audio amplifier was disclosed in U.S. Pat. No. 5,939,938 issued to offer Kalb et al. on Aug. 17, 1999. One problem with these prior audio amplifiers was turn-on and turn-off transients that created noise during the turn-on and turn-off time. The turn-on and turn-off transients produced noises generally referred to as click or pop noises which degraded the usability of the audio amplifier.

Accordingly, it is desirable to have an amplifier that reduces the turn-on and turn-off transients.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
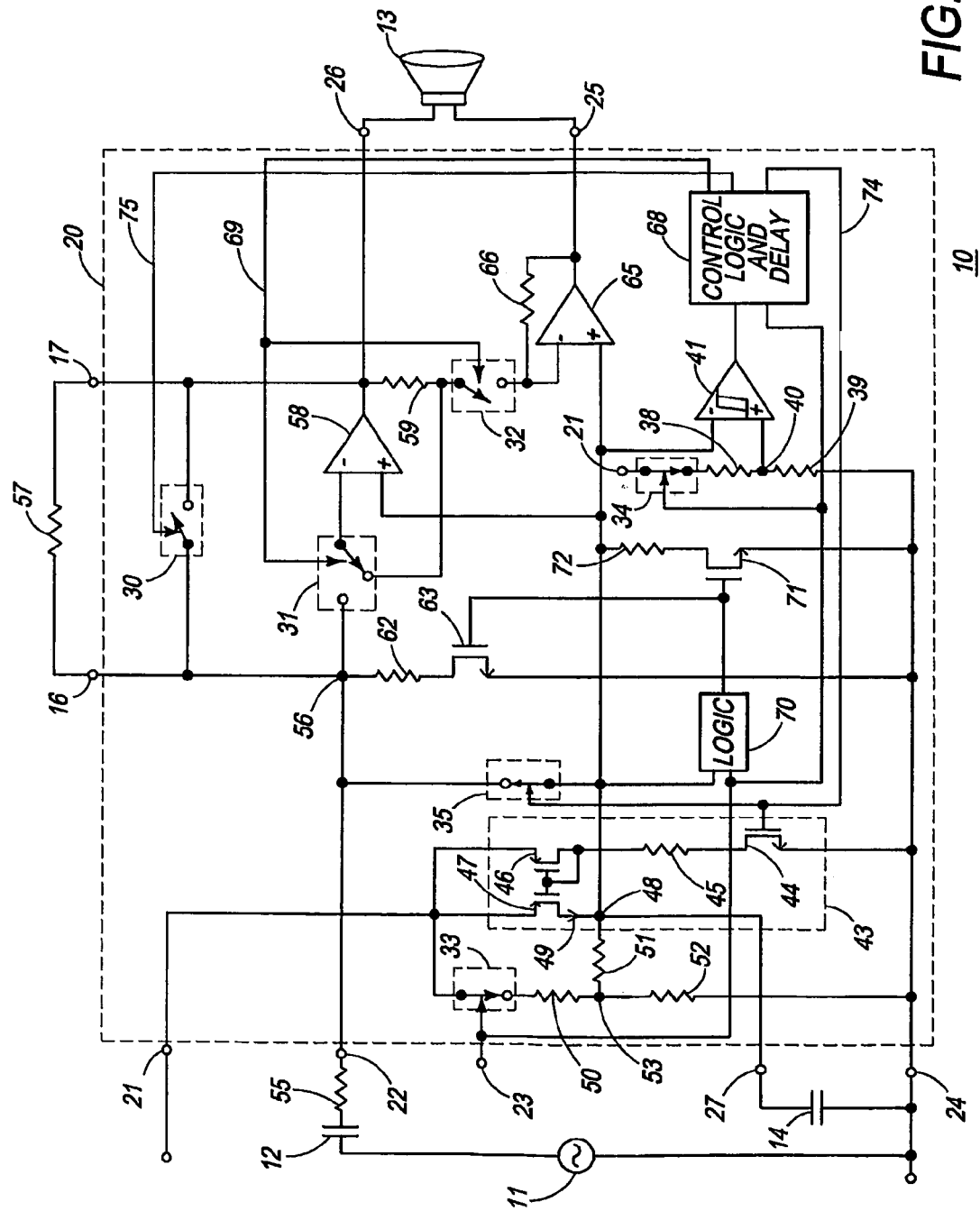
FIG. 1 schematically illustrates an exemplary form of an embodiment of a portion of an audio system that includes an audio amplification circuit illustrated in a first operating mode in accordance with the present invention.

FIG. 1 schematically illustrates an exemplary form of an embodiment of a portion of an audio system 10 that includes an audio amplification circuit 20 that reduces turn-on and turn-off transients. The exemplary form of circuit 20 illustrated in FIG. 1 illustrates circuit 20 configured for operation in a first operating mode or charging operating mode. As will be seen further hereinafter, circuit 20 is configured to operate in various modes in order to minimize transients, such as audible pop and click noises. System 10 provides power to circuit 20 through a power input 21 and a power return 24 of circuit 20. System 10 also generally includes a speaker 13 that is used to convert audio signals from circuit 20 into sound. System 10 provides an audio signal to be amplified from a signal source 11 such as a microphone or MP3 player. The audio signal generally is coupled to a signal input 22 of circuit 20 through an input capacitor 12 and an input resistor 55 that are external to circuit 20. Circuit 20 receives the audio signal and forms a differential signal between outputs 25 and 26 that represents the audio signal received on input 22. The differential signal is used to drive speaker 13.

Circuit 20 generally includes a first amplifier 58 and a second amplifier 65 that are configured to be selectively coupled in a follower configuration with substantially equal gains for at least a portion of one of the various operating modes. Amplifiers 58 and 65 typically are transconductance amplifiers that are selectively formed in different operational amplifier configurations as will be seen further hereinafter. Circuit 20 also generally includes a current source 43, a first reference circuit formed by a switch 33 and resistors 50, 51, and 52 that provides a bias voltage on a bias node 48, a second reference circuit formed by resistors 38 and 39 that forms a reference voltage on a reference node 40, a comparator 41, a control logic and delay circuit 68, switches 30, 31, 32, 33, 34, and 35, and a shut-down circuit that includes a logic circuit or logic 70, transistors 63 and 71, and resistors 62 and 72. Switch 31 is a single pole double throw switch and switches 30, 32, 33, 34, and 35 are single pole single throw switches. Circuit 20 also includes a bias input 27 to which a capacitor 14 is connected in order to filter the bias voltage from node 48. Although not shown in FIG. 1, comparator 41, circuit 68, logic 70, and amplifiers 58 and 65 typically operate from the power supplied between input 21 and return 24. Current source 43 is configured to selectively apply a substantially constant current 49 to bias node 48. In the preferred embodiment, current source 43 includes current mirror coupled transistors 46 and 47, control transistor 44, and resistor 45. However, those skilled in the art will appreciate that current source 43 may be formed by other configurations as long as the configuration selectively provides substantially constant current 49.

The first reference circuit of resistors 50, 51, and 52 receives the input power from input 21 through switch 33 and forms the bias voltage on node 48. This bias voltage is connected to a non-inverting input of amplifiers 58 and 65 in order to form a common mode voltage that is used for the amplification of the signal received on input 22. The second reference circuit of resistors 38 and 39 also receives the input power from input 21 through switch 34 and forms the reference voltage on node 40. The bias voltage from node 48 and the reference voltage from node 40 are received by comparator 41 and assist in the operation of circuit 20 as will be seen further hereinafter.

When power is first applied to circuit 20, capacitor 14 and capacitor 12 are discharged. Circuit 20 is configured to charge capacitors 12 and 14 at substantially the same rate with substantially the same current during a first operating mode of circuit 20. This operation minimizes turn-on transients, such as audible pop and click noise. After power is applied, an enable signal on an enable input 23 of circuit 20 is asserted, forced high for example, to enable the operation of circuit 20. The asserted enable signal enables comparator 41 and amplifiers 58 and 65 to receive power and begin operating. The asserted enable signal also closes switches 33 and 34 and couples the power from input 21 to the first reference circuit and the second reference circuit. Because capacitor 14 is connected to bias node 48, the voltage on node 40 increases faster than the voltage on node 48 which forces the output of comparator 41 high. Circuit 68 receives the high enable signal and the high from comparator 41 and sets the control signal outputs of circuit 68 to control circuit 20 to operate in a first operating mode or charging operating mode. A first control signal 69 from circuit 68 sets switch 31 in a first position as shown in FIG. 1. This first position of switch 31 configures amplifier 58 into a follower configuration by disconnecting the inverting input of amplifier 58 from resistor 57 and connecting the inverting input to resistor 59 in order to receive the output of amplifier 58 through resistor 59. Control signal 69 also sets switch 32 in a first position as shown in FIG. 1 in order to couple amplifier 65 in a follower configuration by disconnecting the inverting input of amplifier 65 from resistor 59. This leaves resistor 66 configured to couple the output of amplifier 65 to the inverting input. As will be seen further hereinafter, in a subsequent operating mode resistors 59 and 66 form the gain elements that establish the gain of the operational amplifier formed by resistors 59 and 66 and amplifier 65. Resistors 59 and 66 are formed to have substantially equal values so that the operational amplifier will have a unity gain. However, in this charging operating mode where resistor 59 forms the gain element for amplifier 58 and resistor 66 forms the gain element for amplifier 65, amplifiers 58 and 65 are each configured in a follower configuration with substantially equal gains because resistors 59 and 66 have substantially equal values. Consequently, the value of the output signals formed at outputs 25 and 26 are substantially equal because amplifiers 58 and 65 have substantially equal gain and receive the same input signal. Since outputs 25 and 26 are at substantially the same value, there is no current flow through speaker 13 and no audible sounds are formed. Circuit 68 also asserts a control signal 75 which opens switch 30 to couple the output of amplifier 58 to input 22. With switch 30 open and switch 31 as shown in FIG. 1, resistor 57 becomes a load for the output of amplifier 58. A second control signal 74 of circuit 68 enables current source 43 to begin supplying current 49. Signal 74 also closes switch 35 and couples node 48 to input 22 so that current 49 may be used to charge both capacitors 12 and 14. In the preferred embodiment of source 43, signal 74 enables transistor 44 causing a first current to flow through transistors 44 and 46 and resistor 45. The current mirror configuration of transistors 46 and 47 forces a substantially equal current to flow through transistor 47 and form current 49. Because switch 35 is closed, current 49 is coupled to charge both capacitors 12 and 14 with current 49 thereby charging capacitors 12 and 14 at a substantially equal rate. Charging capacitors 12 and 14 at the same rate assists in minimizing transients on outputs 25 and 26. Those skilled in the art will appreciate that since the output of amplifier 58 changes slower than the input, current 49 also flows to the output of amplifier 58 through resistor 57 in order to make the output approximately equal to the value of the voltage at node 48.

As source 43 charges capacitor 14, the value of the bias voltage on node 48 increases and becomes greater than the voltage on node 40 which causes the output of comparator 41 to go low.

Figure 2:
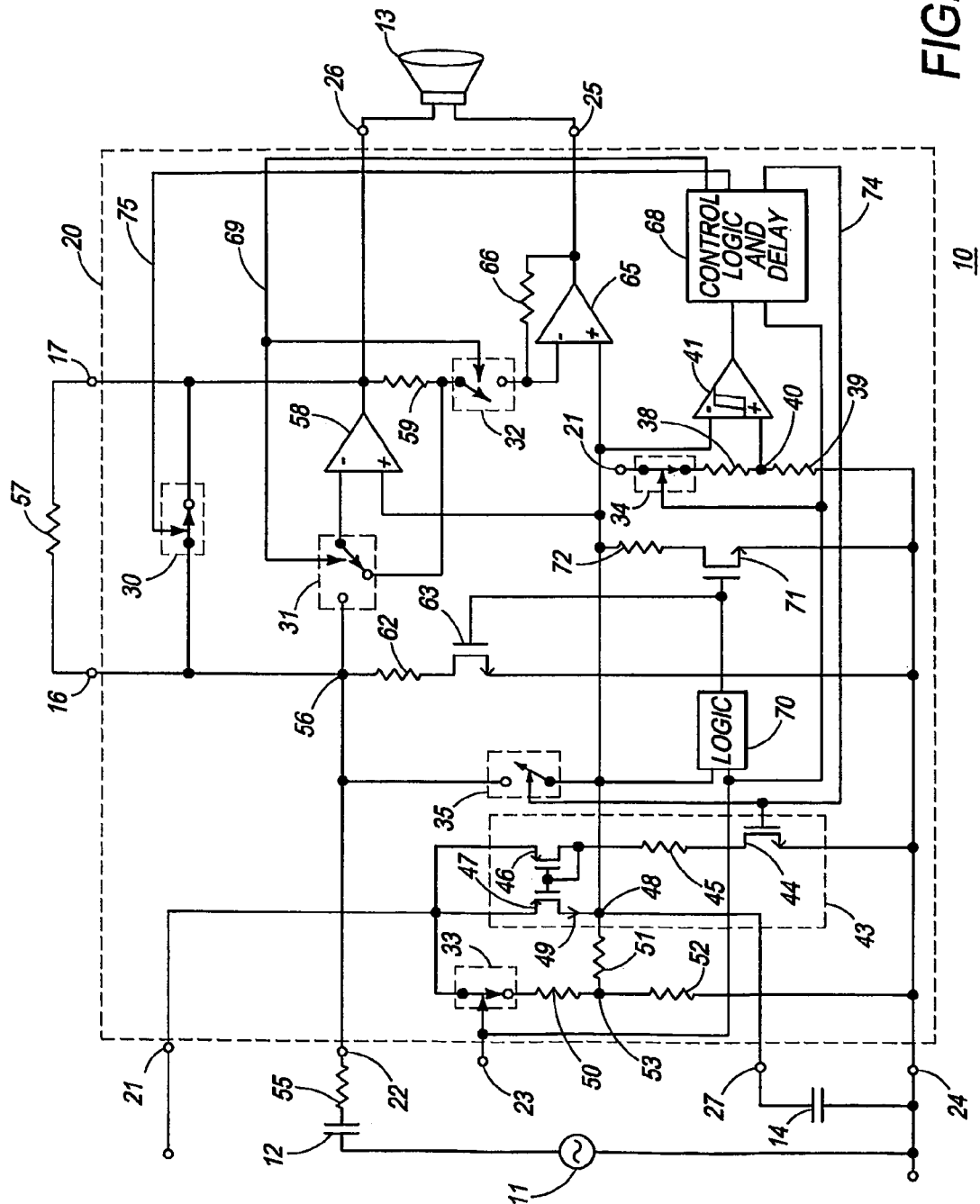
FIG. 2 schematically illustrates the audio amplification circuit of FIG. 1 illustrated in another operating mode in accordance with the present invention.

FIG. 2 schematically illustrates circuit 20 configured for operation in another operating mode or balance mode. Control logic and delay circuit 68 receives the logical low from comparator 41 in addition to the logic high from enable input 23. Circuit 68 decodes the state formed by the input from comparator 41 and the enable input and responsively sets the control signal outputs of circuit 68 to control circuit 20 to operate in the balance mode. Circuit 68 also begins forming a delay with a time interval that assists in minimizing transients, such as audible pop and click noises, on outputs 25 and 26. Although not shown in FIG. 2, the time interval may be formed by a variety of well-known timing circuits including a one-shot circuit or an analog timer such as a current source charging a capacitor. Circuit 68 changes the state of control signals 74 and 75 without changing the state of control signal 69. Negating the state of control signal 74, such as forcing it to a logic low, opens switch 35. Opening switch 35 decouples input 22 from source 43 thereby decoupling circuit 20 from supplying current 49 to capacitor 12. The negated state of signal 74 also disables current source 43 from supplying current 49 by disabling transistor 44. Disabling transistor 44 stops current flow through transistor 46, thus, preventing current flow through transistor 47. Changing the state of signal 75 closes switch 30 to short out resistor 57. Since the output of amplifiers 58 and 65 change slower than the inputs change, there may be a voltage difference between the output of amplifier 58 and the input. Since the current provided by amplifier 58 is a function of resistor 57 closing switch 30 forces the resistance to zero and also forces the current from the output of amplifier 58 to zero thereby preventing amplifier 58 from affecting the voltage on capacitor 12. Those skilled in the art will appreciate that closing switch 30 does not change the gain of amplifier 58. During the time interval of the delay formed by circuit 68, the voltage on node 48 is allowed to settle to the value formed by the reference circuit of resistors 50, 51, and 52. Because this value might be slightly different from the voltage formed on node 48 by current source 43, the time interval allows for the voltage on node 48 to settle after disabling source 43. Because amplifiers 58 and 65 remain configured in the follower configuration with substantially equal gains and the load of resistor 57 is removed, both the inverting and non-inverting inputs of amplifiers 58 and 65 are forced to substantially equal values so that the output of amplifiers 58 and 65 are substantially equal and the resulting differential across outputs 25 and 26 is substantially zero volts. Consequently, there is substantially zero volts (0 V) across speaker 13. This time interval formed by the delay ensures that no audible sound is created by speaker 13 as the voltage on node 48 settles to its operating value. The time interval should be long enough to facilitate node 48 reaching the desired normal operating value. The time interval may be between about two and eight hundred milli-seconds (2-800 msec).

Figure 3:
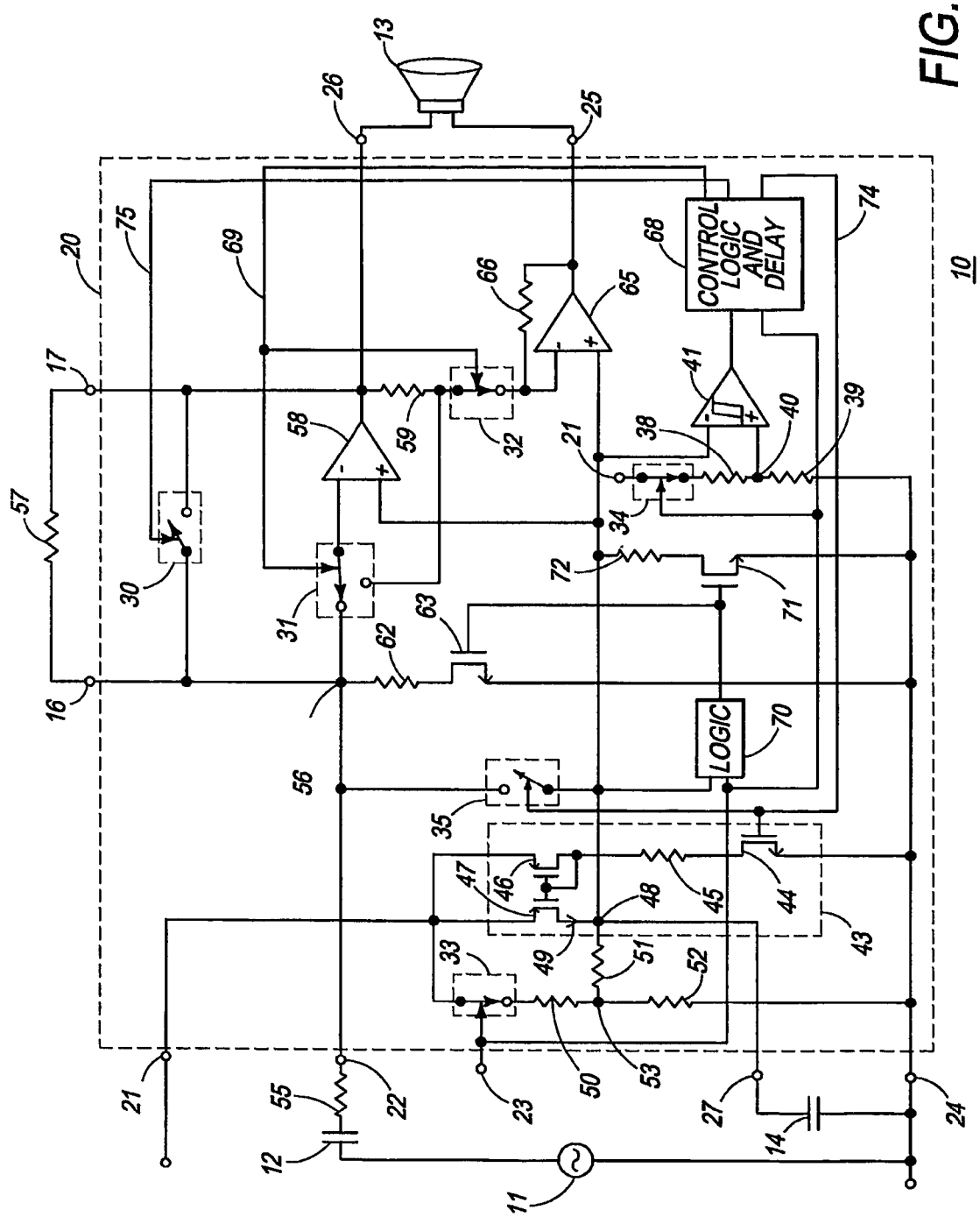
FIG. 3 schematically illustrates the audio amplification circuit of FIG. 1 illustrated in a second operating mode in accordance with the present invention.

FIG. 3 schematically illustrates circuit 20 configured for operation in a second operating mode or normal operating mode. At the end of the time interval formed by the delay, circuit 68 changes the state of control signals 69 and 75 to control circuit 20 to operate in the normal operating mode. Changing the state of signal 75 opens switch 30 and again couples resistor 57 to the output of amplifier 58. Changing the state of signal 69 toggles switch 31 to disconnect the inverting input of amplifier 58 from resistor 59 and connect it to input 22 to receive the audio input signal. Signal 69 also closes switch 32 to connect the inverting input of amplifier 65 to resistor 59 thereby configuring amplifier 65 to receive the output from amplifier 58. Since resistors 59 and 66 have substantially equal values, closing switch 32 connects amplifier 65 in a configuration with a gain of minus one (−1). Toggling switch 31 and opening switch 30 configures amplifier 58 in an operational amplifier configuration with resistor 57 configured as the feedback resistor and resistor 55 configured as the input resistor so that resistors 55 and 57 establish the gain of the operational amplifier that includes amplifier 58. Therefore, amplifier 58 receives the audio input signal from source 11 and amplifies the signal to form an output signal on the output of amplifier 58 that drives output 26. The operational amplifier formed by amplifier 65 and resistors 59 and 66 receives the output signal from amplifier 58 and drives output 25 with a signal that is substantially out of phase and equal in value to the output signal on output 26. Thus, circuit 20 differentially drives speaker 13 with an amplified audio signal that is derived from the audio signal received on input 22. It should be noted that configuring circuit 20 so that resistors 55 and 57 are external to circuit 20 allows a use to select the gain amplifier 58 in the normal mode.

Figure 4:
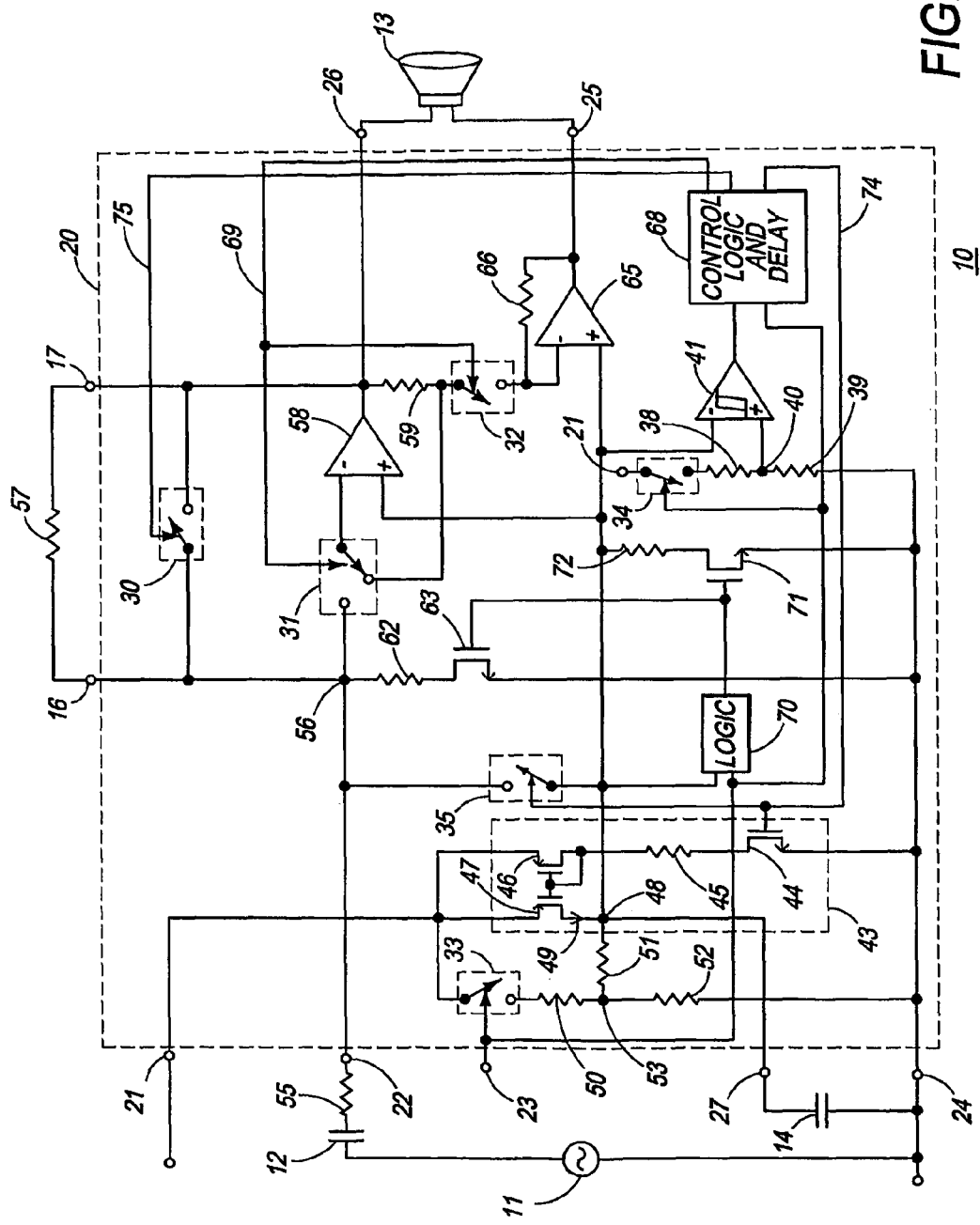
FIG. 4 schematically illustrates the audio amplification circuit of FIG. 1 illustrated in still another operating mode in accordance with the present invention.

FIG. 4 schematically illustrates circuit 20 configured for operation in a shutdown mode. If the enable signal on input 23 is changed to a disable state, for example forced low, circuit 20 is placed in a shutdown mode. The disable state opens switch 33 which decouples the first reference circuit from forming the bias voltage. Logic 70 receives the disable state of the enable signal which forces the output of logic 70 high to enable transistors 63 and 71. Enabling transistor 71 pulls the non-inverting inputs of amplifiers 58 and 65 to the value of return 24 and also discharges capacitor 14. Enabling transistor 63 pulls the inverting input of amplifier 58 to the value of return 24 thereby ensuring that no signals are amplified by amplifiers 58 and 65. Circuit 68 receives the disable state of the enable signal and assists in setting circuit 20 in the shutdown mode. Circuit 68 sets the state of signal 69 to control switches 31 and 32 to place amplifiers 58 and 65 back to the follower configuration as illustrated in FIG. 4. Switch 31 is set back to the first position to disconnect the inverting input of amplifier 58 from resistor 57 and connecting the inverting input to resistor 59 in order to receive the output of amplifier 58 through resistor 59. Control signal 69 also sets switch 32 back to the first position by disconnecting the inverting input of amplifier 65 from resistor 59. This leaves resistor 66 configured to couple the output of amplifier 65 to the inverting input. Therefore, the input to both amplifiers receives substantially the same signal during the shutdown operation, thus, there is no differential signal across outputs 25 and 26 and no audio signals are produced by speaker 13. The low enable signal also decouples comparator 41 and amplifiers 58 and 65 from receiving power thereby disabling comparator 41 from driving the input of circuit 68 and disabling amplifiers 58 and 65 from driving respective outputs 26 and 25. Those skilled in the art will appreciate that amplifiers 58 and 65 and comparator 41 may be decoupled from receiving power by a variety of well-known means including disabling the current source of the differentially configured transistors that form the differential input stages of comparator 41 and amplifiers 58 and 65. Decoupling amplifiers 58 and 65 from receiving power and forcing the input of amplifiers 58 and 65 to receive substantially zero volts ensures that no audio signals are produced by speaker 13 during the shutdown operation.

In order to facilitate this functionality for circuit 20, input 21 is commonly connected to a first terminal of switch 34, a first terminal of switch 33, a source of transistor 47, a source of transistor 46, and to a power input of comparator 41, amplifier 58, amplifier 65, circuit 68, and logic 70. A first input terminal of switch 31 is commonly connected to input 22, a first terminal of resistor 62, a first terminal of switch 35, a first terminal of resistor 57, and a first terminal of switch 30. A second terminal switch 35 is connected to node 48. A second terminal of switch 30 is commonly connected to a second terminal of resistor 57, the output of amplifier 58, a first terminal of resistor 59, and output 26. A control input of switch 30 is connected to a first output of circuit 68. A second input a switch 31 is commonly connected to a second terminal of resistor 59 and a first terminal of switch 32. An output of switch 31 is connected to the non-inverting input of amplifier 58. A control input of switch 31 is commonly connected to a control input of switch 32 and a second output of circuit 68. A second terminal of switch 32 is commonly connected to the inverting input of amplifier 65 and a first terminal of resistor 66. A second terminal of resistor 66 is commonly connected to the output of amplifier 65 and output 25. A non-inverting input of amplifier 65 is commonly connected to a non-inverting input of amplifier 58 and to node 48. A drain of transistor 47 is connected to node 48, input 27, and a first terminal of resistor 51. A drain of transistor 46 is commonly connected to a gate of transistor 46, a gate of transistor 47, and a first terminal of resistor 45. Resistor 45 has a second terminal connected to a drain of transistor 44. A source of transistor 44 is connected to return 24. A gate of transistor 44 is commonly connected to a control input a switch 35 and a third output of circuit 68. A second terminal of resistor 51 is commonly connected to node 53, a first terminal of resistor 50, and a first terminal of resistor 52. A second terminal of resistor 52 is connected to return 24. A second terminal of resistor 50 is connected to a second terminal of a switch 33. A control input of switch 33 is commonly connected to input 23, a first input of logic 70, a first input of circuit 68, a control input of switch 34, and a power control input of comparator 41 and amplifiers 58 and 65. A second terminal of switch 34 is connected to a first terminal of resistor 38 which has a second terminal connected to node 40 and to a first terminal of resistor 39. A second terminal of resistor 39 is connected to return 24. Node 40 is connected to a non-inverting input of comparator 41. An inverting input of comparator 41 is connected to node 48. The output of comparator 41 is connected to a second input of circuit 68. A second input of logic 70 is connected to node 48. The output of logic 70 is commonly connected to a gate of transistor 71 and a gate of transistor 63. A source of transistors 63 and 71 are connected to return 24. A drain of transistor 63 is connected to a second terminal of resistor 62. A drain of transistor 71 is connected to a first terminal of resistor 72 which has a second terminal connected to node 48.

Figure 5:
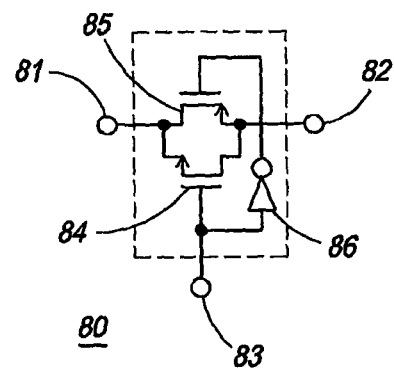
FIG. 5 schematically illustrates an exemplary form of an embodiment of a switch that may be used in the audio amplification circuit of FIG. 1 in accordance with the present invention.

FIG. 5 schematically illustrates an exemplary embodiment of a portion of a switch 80 that may be used to implement switches 30, 32, 33, and 34. Switch 80 includes an inverter 86 in addition to a P-channel transistor 85 and an N-channel transistor 84 that are coupled back-to-back. Switch 80 includes a first terminal 81, a second terminal 82, and a control terminal 83. If the control signal on control terminal 83 is high, transistors 84 and 85 are enabled to pass a signal from terminal 81 to terminal 82. If terminal 83 is low, both transistors 84 and 85 are disabled and terminal 81 is decoupled from terminal 82. Those skilled in the art will appreciate that of the transistor configurations may also be used to implement switches 30, 32, 33, and 34 and that another transistor configuration may be used to implement switch 31.

Figure 6:
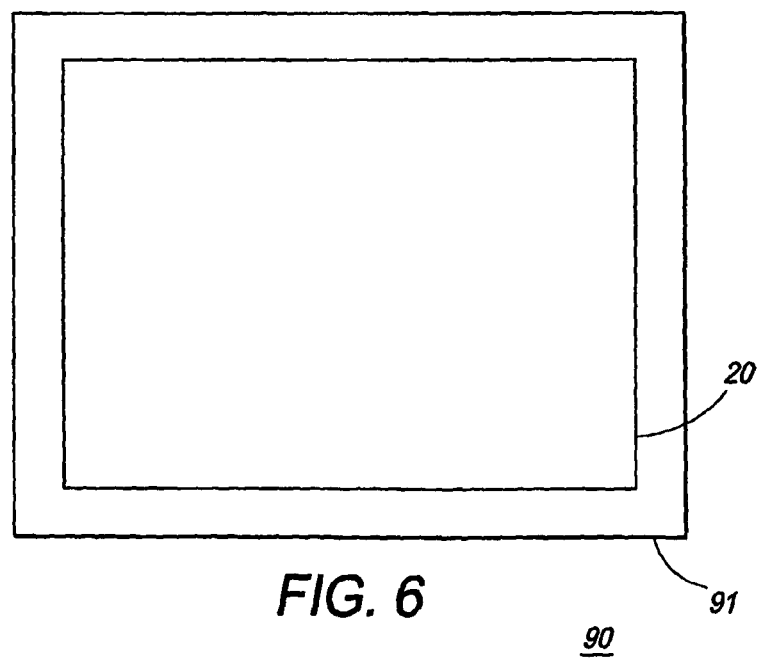
FIG. 6 schematically illustrates an enlarged plan view of a semiconductor device that includes the audio amplification circuit of FIG. 1 in accordance with the present invention.

FIG. 6 schematically illustrates an enlarged plan view of a portion of an embodiment of a semiconductor device or integrated circuit 90 that is formed on a semiconductor die 91.

Circuit 20 is formed on die 91. Die 91 may also include other circuits that are not shown in FIG. 6 for simplicity of the drawing. Circuit 20 and device or integrated circuit 90 are formed on die 91 by semiconductor manufacturing techniques that are well known to those skilled in the art. Circuit 20 generally is formed on a semiconductor substrate as an integrated circuit and assembled into a semiconductor package.

In view of all of the above, it is evident that a novel device and method is disclosed. Included, among other features, is using one of the gain resistors of amplifier 65 to form the gain resistor of amplifier 58 in the charging mode thereby ensuring that amplifiers 58 and 65 have substantially equal gains. Configuring both of amplifiers 58 and 65 in a follower configuration ensures that there is no differential output signal. Creating a delay after charging the capacitors and before operating in the normal operating mode allows the bias voltage to settle and assists in minimizing undesirable noises during the startup period. Using external resistors for the gain resistors of amplifier 58 allows the gain of circuit 20 to be selected by a user of circuit 20. Since the method used to minimize the transient noises is independent of the gain resistors of amplifier 58, changing the value of the external resistor does not affect the transient suppression of circuit 20.

While the subject matter of the invention is described with specific preferred embodiments, it is evident that many alternatives and variations will be apparent to those skilled in the semiconductor arts. For example, source 43 may be replaced by a current source with a different configuration. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. An audio amplification circuit comprising:
    a signal input configured to receive an input signal;
    a first reference circuit configured to form a first reference voltage at biasing node;
    a control circuit configured to set a first operating mode of the audio amplification circuit and set a second operating mode of the audio amplification circuit;
    a current source configured to selectively provide a first current to the biasing node and to the signal input responsively to the first operating mode;
    a first amplifier having a first input coupled to receive the first reference voltage, a second input configured to selectively couple the first amplifier in a follower configuration with a first gain responsively to the first operating mode, and an output coupled to drive a first output of the audio amplification circuit; and
    a second amplifier having a first input coupled to receive the first reference voltage, a second input configured to selectively couple the second amplifier in a follower configuration with the first gain responsively to the first operating mode, and an output coupled to drive a second output of the audio amplification circuit.

2. The audio amplification circuit of claim 1 wherein the second input of the second amplifier is configured to be selectively coupled to the output of the first amplifier responsively to the second operating mode.

3. The audio amplification circuit of claim 2 wherein the second input of the second amplifier is configured to be selectively decoupled from the output of the first amplifier responsively to the first operating mode.

4. The audio amplification circuit of claim 2 further including a first gain resistor of the second amplifier coupled to the output of the first amplifier and a switch coupled between the first gain resistor of the second amplifier and the second input of the second amplifier.

5. The audio amplification circuit of claim 4 further including a second gain resistor of the second amplifier coupled between the output of the second amplifier and the second input of the second amplifier.

6. The audio amplification circuit of claim 1 wherein a first gain resistor of the second amplifier is selectively coupled as a gain resistor of the first amplifier responsively to the first operating mode and wherein a second gain resistor of the second amplifier is coupled from the output of the second amplifier to the second input of the second amplifier and has a value that is substantially equal to a value of the first gain resistor of the second amplifier.

7. The audio amplification circuit of claim 6 wherein a first gain resistor of the second amplifier is selectively coupled from the output of the first amplifier to the second input of the second amplifier responsively to the second operating mode.

8. The audio amplification circuit of claim 1 wherein the current source remains coupled to the biasing node during the first and second operating modes.

9. The audio amplification circuit of claim 1 further including a second reference circuit configured to form a second reference voltage wherein the control circuit sets the first operating mode responsively to a difference between the first reference voltage and the second reference voltage.

10. The audio amplification circuit of claim 1 wherein the control circuit is configured to form a delay having a first time interval before setting the second operating mode wherein the signal input is decoupled from receiving the first current during at least a portion of the first time interval and wherein the first amplifier and the second amplifier remain coupled in the follower configurations.

11. The audio amplification circuit of claim 1 further including a first gain resistor of the first amplifier coupled from the output of the first amplifier to the signal input wherein the signal input is configured to receive the input signal from a second gain resistor of the first amplifier that is to be coupled to the signal input.

12. The audio amplification circuit of claim 11 wherein a switch is coupled between the first gain resistor of the first amplifier and the second input of the first amplifier.

13. A method of forming an amplification circuit comprising:
    configuring a first amplifier to selectively operate in a follower configuration having a first gain responsively to a first operating mode of the amplification circuit and to selectively operate in a non-follower configuration having a second gain that is different from the first gain responsively to a second operating mode;
    configuring a second amplifier to selectively operate in a follower configuration having the first gain responsively to the first operating mode and to selectively operate in a non-follower configuration having a third gain that is different from the first gain and the second gain responsively to the second operating mode;
    configuring a control circuit to form a delay having a first time interval between the first operating mode and the second operating mode and control the first amplifier and the second amplifier to remain coupled in the follower configuration for at least a portion of the first time interval; and
    configuring the amplification circuit to couple a current source to supply a current to a signal input of the amplification circuit and to selectively couple the current source to supply the current to a biasing node of the amplification circuit responsively to the first operating mode and to selectively decouple the current source from supplying the current to the signal input responsively to the control circuit forming the delay.

14. The method of claim 13 wherein the control circuit is configured to assert a first control signal that causes the first and second amplifiers to be selectively configured in the follower configurations and is configured to assert a second control signal that causes the current source to be selectively coupled to supply the current to the signal input and negate the second control signal to cause the current to be selectively decoupled from the signal input.

15. The method of claim 13 further including configuring the control circuit to not change the first gain of the first amplifier during the first time interval.

16. The method of claim 13 wherein configuring the control circuit to form the delay includes coupling the current source to supply the current to a biasing node to form a first reference voltage, coupling a second reference circuit to form a second reference voltage at a second node, and configuring the control circuit to set the first operating mode responsively to a first difference between the first and second reference voltages.

17. An amplification method comprising:
    charging a bias capacitor of an audio amplifier circuit with a current and selectively charging an input capacitor with the current prior to using the audio amplifier circuit to amplify an input signal;
    coupling a first amplifier and a second amplifier of the audio amplifier circuit in a follower configuration with substantially equal gains and coupling the first and second amplifiers to receive a signal from the bias capacitor at least a portion of a period that the input capacitor is charged;
    decoupling the input capacitor from receiving the current for a first time interval prior to using the audio amplifier circuit to amplify the input signal; and
    coupling the first amplifier in a non-follower configuration to receive the input signal and coupling the second amplifier in a non-follower configuration to receive an output of the first amplifier following the first time interval.

18. The method of claim 17 wherein coupling the first amplifier and the second amplifier of the audio amplifier circuit in the follower configuration with substantially equal gains includes selectively coupling a first gain element of the second amplifier as a gain element of the first amplifier prior to the first time interval and coupling the first gain element of the second amplifier to receive the output of the first amplifier following the first time interval.

19. The method of claim 17 wherein charging the bias capacitor of the audio amplifier circuit with the current includes coupling a current source to a bias node subsequent to the first time interval.

* * * * *